United States Patent
Sekine et al.

(10) Patent No.: US 7,645,777 B2
(45) Date of Patent: Jan. 12, 2010

(54) SWITCHING DEVICE

(75) Inventors: Nobuyuki Sekine, Hachioji (JP); Haruo Kawakami, Miura (JP); Hisato Kato, Hachioji (JP); Keisuke Yamashiro, Yokosuka (JP); Kyoko Kato, Zushi (JP); Masami Kuroda, Zushi (JP)

(73) Assignee: Fuji Electric Holdings Co., Ltd. (JP)

( * ) Notice: Subject to any disclaimer, the term of this patent is extended or adjusted under 35 U.S.C. 154(b) by 124 days.

(21) Appl. No.: 11/561,596

(22) Filed: Nov. 20, 2006

(65) Prior Publication Data

US 2007/0108441 A1 May 17, 2007

Related U.S. Application Data

(63) Continuation of application No. PCT/JP2005/009182, filed on May 19, 2005.

(30) Foreign Application Priority Data

May 20, 2004 (JP) ............................. 2004-149963

(51) Int. Cl.
*A61K 31/381* (2006.01)
*A61K 31/4436* (2006.01)

(52) U.S. Cl. ..................................... 514/337; 514/444

(58) Field of Classification Search ................. 514/337, 514/444

See application file for complete search history.

(56) References Cited

U.S. PATENT DOCUMENTS

2006/0054882 A1  3/2006  Kawakami et al.

FOREIGN PATENT DOCUMENTS

| EP | 1 598 877 A1 | 11/2005 |
|---|---|---|
| WO | 2004/006351 A1 | 1/2004 |
| WO | 2004/073081 A1 | 8/2004 |

OTHER PUBLICATIONS

Potember et al.; "Electrical switching and memory phenomena in Cu-TCNQ thin films"; Appl. Phys. Lett., vol. 34, No. 6; Mar. 15, 1979; pp. 405-407.

Kumagai et al; "Current-Inducing Metallization and Stripe Pattern Formation of K-TCNQ Crystals"; Kotai Buturi (Solid State Physics); vol. 35, No. 1 (2000); p. 35.

Adachi et al.; Formation of Cu:TCNQ CT-Complex thin films by vacuum co-deposition and the switching devices; Oyo Butsuri Gakkai Yokoshu; Mar. 2002, Third issue, 27a-M-5, p. 1236.

Relevant portion of International Search Report issued in Int. Appl. No. PCT/JP2005/009182.

*Primary Examiner*—Taofiq A Solola
(74) *Attorney, Agent, or Firm*—Rossi, Kimms & McDowell, LLP

(57) ABSTRACT

A switching device is discloses that exhibits two stable resistance values to a voltage applied between electrodes. The switching device comprises thin films of a first electrode layer, an organic bistable material layer and a second electrode layer sequentially formed on a substrate, and the organic bistable material is a specified quinone compound.

4 Claims, 8 Drawing Sheets

Partial Charge Transfer

SWITCHING DEVICE

CROSS REFERENCE TO RELATED APPLICATIONS

This application is a continuing application based on International Application no. PCT/JP2005/009182 filed May 19, 2005, which claims priority from Japanese application Serial No. JP 2004-149963 filed on May 20, 2004, the contents of which are incorporated herein in their entirety.

BACKGROUND OF THE INVENTION

A. Field of the Invention

The present invention relates to a switching device that can be used for driver switching devices of a display panel using an organic EL or a liquid crystal, and for high density memories.

B. Description of the Related Art

Recently, the performance of organic electronic materials has made spectacular advances. Some low dimensional conductors, such as charge transfer complexes, exhibit a distinctive property, for example, metal-insulator transition, and have been studied for application to driver switching devices of organic EL display panels or to high density memories.

Organic bistable materials are drawing attention as materials that can be applied to the switching devices. An organic bistable material is an organic material showing a so-called non-linear response. A switching phenomenon is observed in which the current in a circuit abruptly increases at a certain voltage when an increasing voltage is applied to the material.

FIG. 7 shows an example of voltage-current characteristic of an organic bistable material exhibiting such switching behavior. As shown in FIG. 7, an organic bistable material has two current-voltage characteristics of a high resistance state 51 (off state) and a low resistance state 52 (on state), and exhibits a non-linear response property. Preliminarily applying a bias voltage Vb, when a voltage is raised up to Vth2 (upper threshold voltage) or higher, a transition from off-state to on-state occurs, and when the voltage is lowered down to Vth1 (lower threshold voltage) or lower, a transition from on-state to off-state occurs, changing the resistance value of the material. A so-called switching action can be performed by applying a voltage at Vth2 or higher or a voltage at Vth1 or lower to the organic bistable material. The Vth1 and Vth2 can be voltages in pulse form.

Known organic bistable materials exhibiting non-linear response include various types of organic complexes. For example, R. S. Potember et al. produced a switching device having two stable resistance values for a voltage using Cu-TCNQ (copper—tetracyanoquinodimethane) complex (R. S. Potember et al., *Appl. Phys. Lett.*, vol. 34, p. 405 (1979)). Kumai et al. observed switching behavior caused by non-linear response using a single crystal of K-TCNQ (potassium—tetracyanoquinodimethane) complex (Kumagai et al., *Kotai Buturi* (Solid State Physics), vol. 35, p. 35 (2000)). Adachi et al. formed a thin film of Cu-TCNQ complex by means of vacuum evaporation, and revealing its switching characteristic, studied the feasibility of applying it to an organic EL matrix (Adachi et al., Abstract of 2002 Spring Meeting of the Japanese Society of Applied Physics, third volume, p. 1236).

The switching devices using an organic charge transfer complex mentioned above, however, had the problems described in the following. The organic bistable material, being a charge transfer complex, is a two-component material consisting of a molecule or a metallic element exhibiting a donor characteristic and a molecule such as TCNQ exhibiting an acceptor characteristic.

Consequently, fabrication of a switching device requires strict control of the composition ratio of the two components. In the charge transfer complex of a two-component system, as shown in FIG. 8, each of the donor molecules and the acceptor molecules laminates in a columnar shape forming donor molecule column 61 and acceptor molecule column 62, and the components of each column perform partial charge transfer between the molecules (or metal atoms) exhibiting bistability. Therefore, any excess or deficiency in the proportion of the two components critically affects the bistable performance of the device as a whole.

In the Cu-TCNQ complex mentioned above, for example, different proportions between Cu and TCNQ bring about different crystallinity and electrical characteristics and cause variation in bistable performance. It is particularly difficult to obtain a large area and uniform film when using film deposition by means of vacuum evaporation, due to differences in vapor pressure of the two components and, in the case of co-evaporation, geometric arrangement of the individual evaporation source for each material. Therefore, it is difficult to mass produce switching devices that perform with a steady bistability characteristic and uniform quality from the conventional organic bistable materials of two-component systems.

The present invention is directed to overcoming or at least reducing the effects of one or more of the problems set forth above.

SUMMARY OF THE INVENTION

In light of the above problems in the conventional technology, it is an object of the present invention to provide a switching device suited for mass production in which variation of material composition is suppressed and a steady bistability characteristic is achieved.

A switching device of the invention has two stable resistance values to a voltage applied between electrodes. The switching device comprises thin films of a first electrode layer, an organic bistable material layer, and a second electrode layer sequentially formed on a substrate. The organic bistable material is a quinone compound represented by general formula (1).

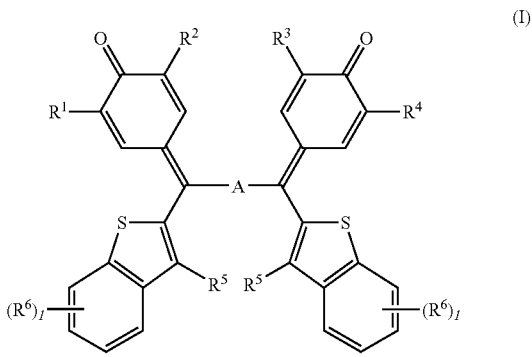

(I)

In the formula (I), $R^1$, $R^2$, $R^3$, and $R^4$, which can be the same or different from each other, represent a hydrogen atom, an alkyl group of carbon number of 1 to 6 that can have a substituent(s), or an aryl group that can have a substituent(s); $R^5$ and $R^6$, which can be the same or different from each other, represent a hydrogen atom, an alkyl group of carbon number of 1 to 6 that can have a substituent(s), an aryl group that can have a substituent(s), an alkoxy group, or a halogen atom; "A" represents one of the formulas (A-1) through (A-9); and I represents an integer from 1 to 4.

(A-1)

(A-2)

(A-3)

(A-4)

(A-5)

(A-6)

(A-7)

(A-8)

(A-9)

Another switching device of the invention has two stable resistance values to a voltage applied between electrodes. The switching device comprises thin films of a first electrode layer, an organic bistable material layer, and a second electrode layer sequentially formed on a substrate. The organic bistable material is a quinone compound represented by general formula (II).

(II)

In the formula (II), $R^7$, $R^8$, $R^9$, $R^{10}$, and $R^{11}$, which can be the same or different from each other, represent a hydrogen atom, an alkyl group of carbon number of 1 through 6 that can have a substituent(s), or an aryl group that can have a substituent(s); $R^{12}$ and $R^{13}$, which can be the same or different from each other, represent a hydrogen atom, an aryl group that can have a substituent(s), or a heterocyclic group that can have a substituent(s); and I is an integer of 1 or 2. In a preferred embodiment, $R^{12}$ and $R^{13}$, which can be the same or different from each other, are selected from the following formulas (R-1) through (R-7).

(R-1)

(R-2)

(R-3)

(R-4)

(R-5)

(R-6)

(R-7)

In the above formulas, X represents a hydrogen atom, an alkyl group of carbon number of 1 to 6 that can have a substituent(s), an aryl group that can have a substituent(s), an alkoxy group, or a halogen atom; $y^1$ and $y^2$, which can be the same or different from each other, represent a hydrogen atom, an alkyl group of carbon number of 1 to 6 that can have a substituent(s), an aryl group that can have a substituent(s), an alkoxy group, or a halogen atom; m is an integer from 1 to 5; and n is an integer from 1 to 4.

An organic bistable material in a switching device of the invention, being a material of a one-component system consisting of one type of material, can never give rise to the variation of composition ratio in manufacturing process which can occur in a conventional organic bistable material of a two-component system, and thus always exhibits steady bistable performance. When the thin film is formed by means of vacuum evaporation in particular, the production can be carried out with high efficiency because a complicated process such as co-evaporation need not be employed, and it can be formed with homogeneity in a large area at a low cost.

A quinone compound in the invention is preferably selected from the compounds represented by the structural formulas (I-1), (I-2), and (II-1) below.

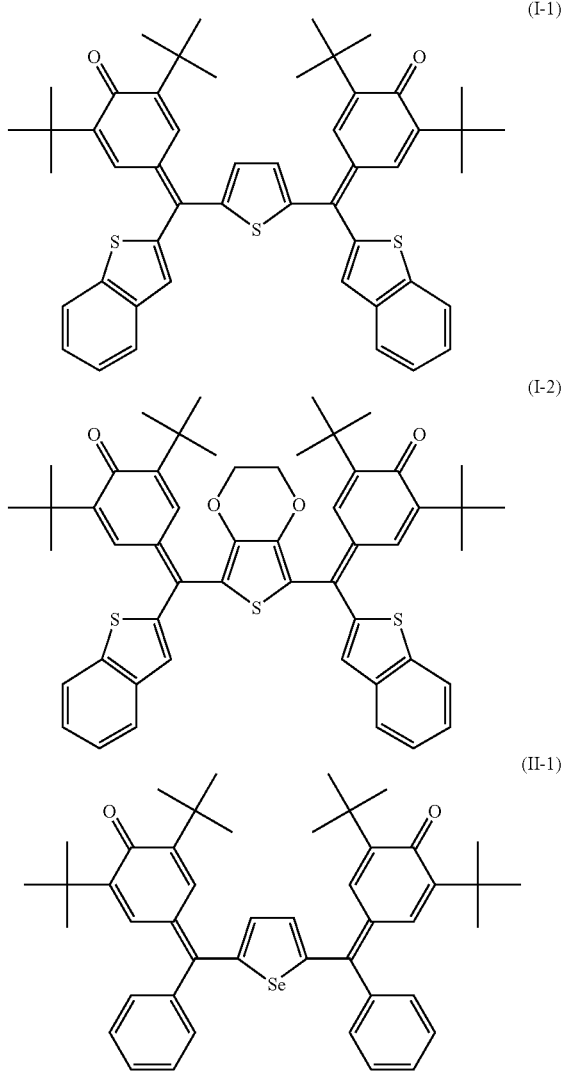

These quinone compounds exhibit excellent characteristics for bistable characteristic because of high ratio of the resistance in the high resistance state/the resistance in the low resistance state. Therefore, the quinone compounds can be favorably used for an organic bistable material.

The present invention suppresses variation in material composition and provides a steady bistable performance, and thus provides a switching device suitable for mass production and exhibiting good repetition performance. Therefore, the switching device can be used for a driver switching device of organic EL display panels and for high density memories.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
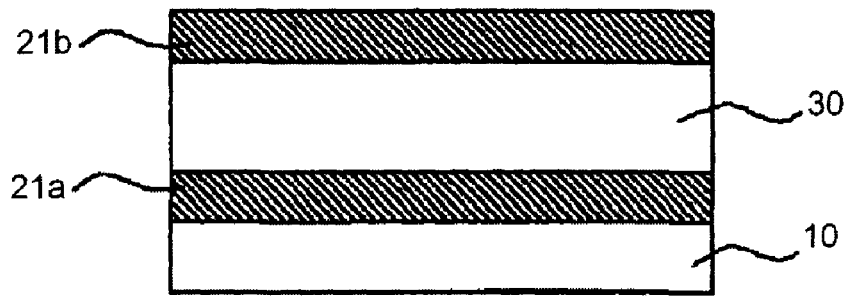
FIG. 1 illustrates a schematic structure of a switching device according to an embodiment of the invention.

Now, the present invention will be described in detail with reference to the accompanying drawings. FIG. 1 illustrates a schematic structure of a switching device according to an embodiment of the invention.

Referring to FIG. 1, the switching device comprises first electrode layer 21a, organic bistable material layer 30, and second electrode layer 21b sequentially laminated on substrate 10. Substrate 10 can be favorably composed of a known glass substrate, but is not limited to this material.

Materials for first electrode layer 21a and second electrode layer 21b can be appropriately selected from metals including aluminum, gold, silver, chromium, nickel, and iron, inorganic materials including ITO and carbon, organic materials including conjugated organic compounds and liquid crystals, and semiconductors including silicon, without any special limitation.

Thin films of first electrode layer 21a and second electrode layer 21b can be formed by means of known methods, for example, an evaporation method or a sputtering method, without any special limitation. These film formation methods can be conducted in a normal vacuum and further in a vacuum environment in which a reactive gas such as oxygen, moisture, or nitrogen is introduced. An application of electric field or electric discharge can be conducted in a vacuum environment to control material properties of the film. Sputtering can be carried out by a dc method and an rf method as usual, but is not limited to these methods.

When first electrode layer 21a and second electrode layer 21b are formed by vacuum evaporation, the substrate temperature in the evaporation process is appropriately selected corresponding to the electrode material used, and preferably is in the range of 0 to 150° C. The film thickness is preferably in the range of 50 to 200 nm.

A thin film of organic bistable material layer 30 is formed on first electrode layer 21a. An organic bistable material used for organic bistable material layer 30 is preferably a compound having both an electron donating functional group and an electron attracting functional group within one molecule. Such a compound having both an electron donating functional group and an electron attracting functional group within one molecule in the invention is preferably a quinone compound represented by the general formula (I) below.

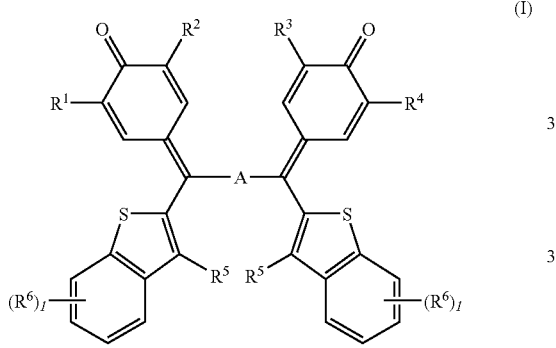

(I)

In the formula (I), $R^1$, $R^2$, $R^3$, and $R^4$, which can be the same or different from each other, represent a hydrogen atom, an alkyl group of carbon number of 1 to 6 that can have a substituent(s), or an aryl group that can have a substituent(s); $R^5$ and $R^6$, which can be the same or different from each other, represent a hydrogen atom, an alkyl group of carbon number of 1 to 6 that can have a substituent(s), an aryl group that can have a substituent(s), an alkoxy group, or a halogen atom; "A" represents one of the formulas (A-1) through (A-9); and I represents an integer from 1 to 4.

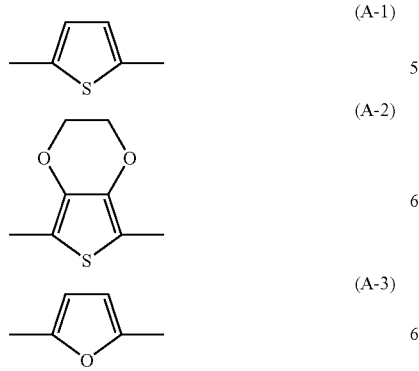

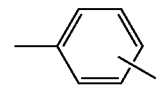

(A-4)

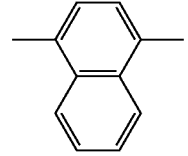

(A-5)

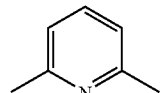

(A-6)

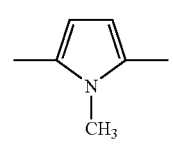

(A-7)

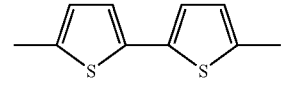

(A-8)

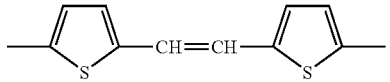

(A-9)

A quinone compound represented by the general formula (II) below can also be used.

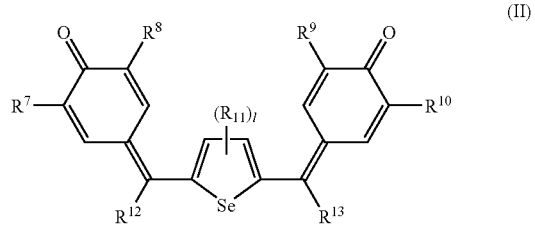

(II)

In the formula (II), $R^7$, $R^8$, $R^9$, $R^{10}$, and $R^{11}$, which can be the same or different from each other, represent a hydrogen atom, an alkyl group of carbon number of 1 through 6 that can have a substituent(s), or an aryl group that can have a substituent(s); $R^{12}$ and $R^{13}$, which can be the same or different from each other, represent a hydrogen atom, an aryl group that can have a substituent(s), or a heterocyclic group that can have a substituent(s); and I is an integer of 1 or 2.

In the quinone compound represented by the general formula (II) above of a preferred embodiment of the invention, $R^{12}$ and $R^{13}$, which can be the same or different from each other, are selected from the following formulas (R-1) through (R-7).

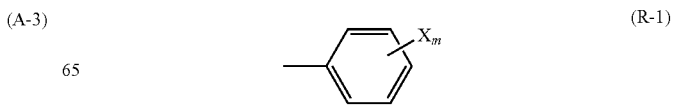

(R-1)

-continued

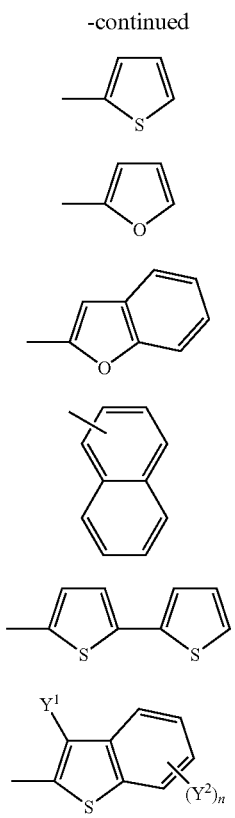

(R-2)
(R-3)
(R-4)
(R-5)
(R-6)
(R-7)

In the above formulas, X represents a hydrogen atom, an alkyl group of carbon number of 1 to 6 that can have a substituent(s), an aryl group that can have substituent(s), an alkoxy group, or a halogen atom; $Y^1$ and $y^2$, which can be the same or different from each other, represent a hydrogen atom, an alkyl group of carbon number of 1 to 6 that can have substituent(s), an aryl group that can have substituent(s), an alkoxy group, or a halogen atom; m is an integer from 1 to 5; and n is an integer from 1 to 4.

Specific quinone compound of the formula (I) can be selected from the compounds represented by the following structural formulas (I-1) through (I-16). Specific quinone compound of the formula (II) can be selected from the compounds by the following structural formulas (II-1) through (II-13).

-continued

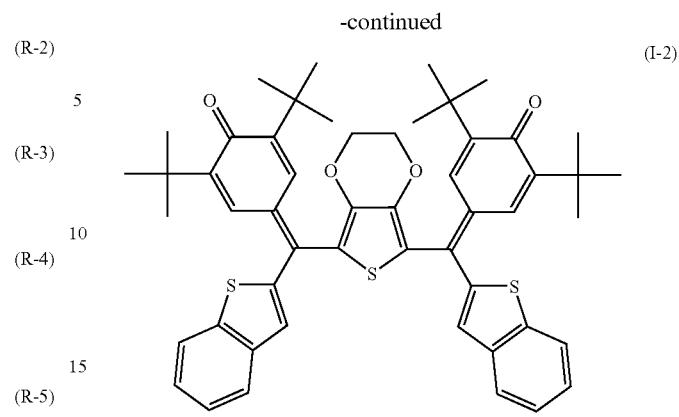

(I-2)

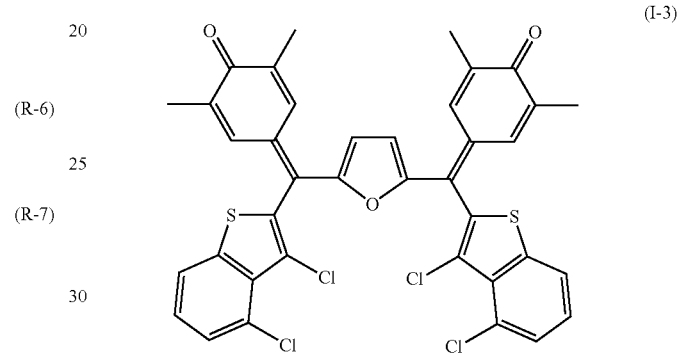

(I-3)

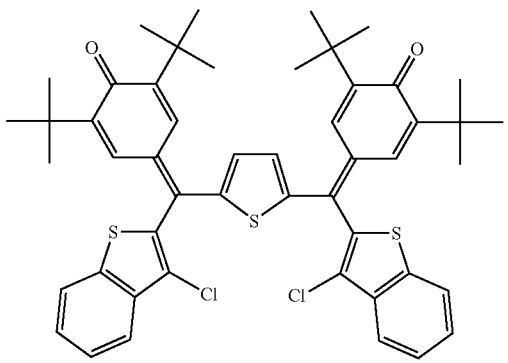

(I-4)

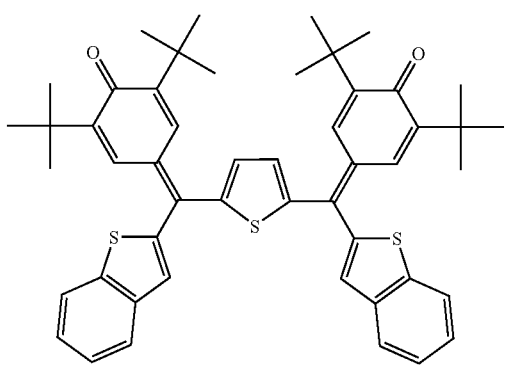

(I-1)

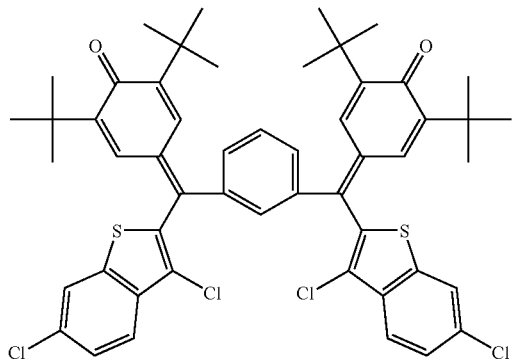

(I-5)

-continued
(I-6)
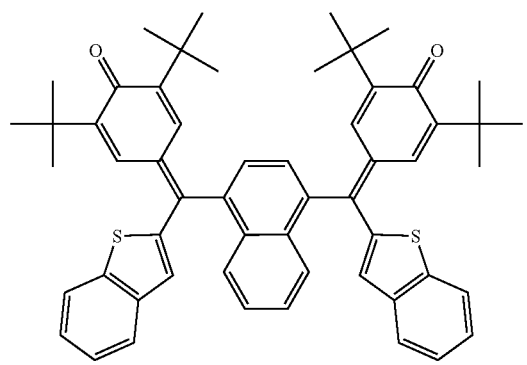
(I-7)
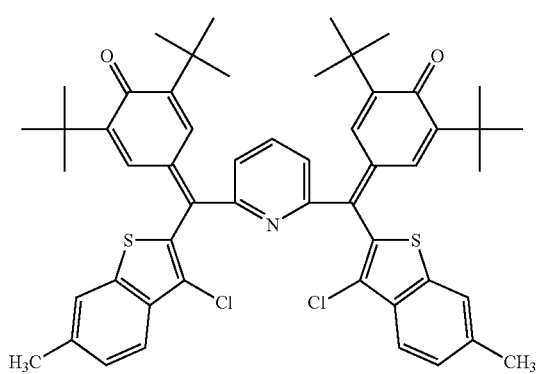
(I-8)
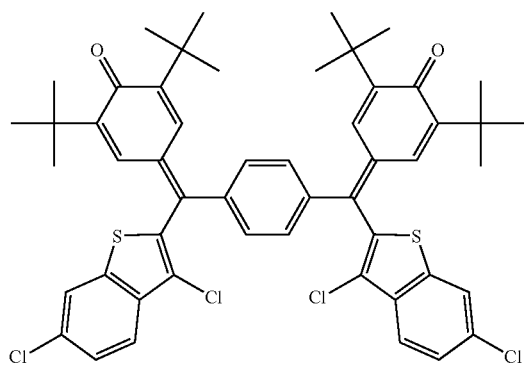
(I-9)
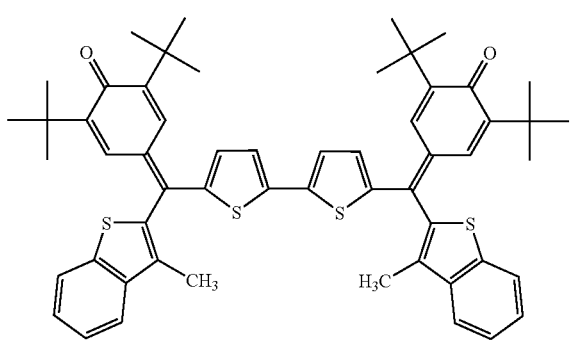
-continued
(I-10)
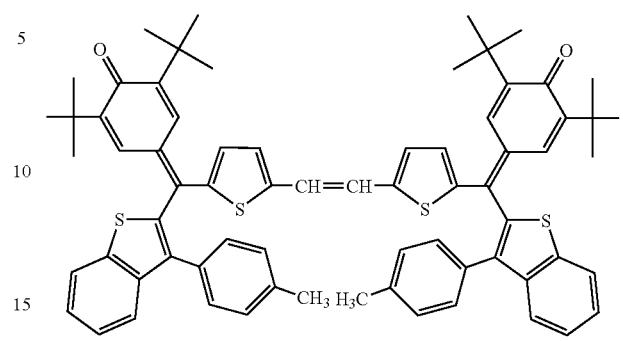
(I-11)
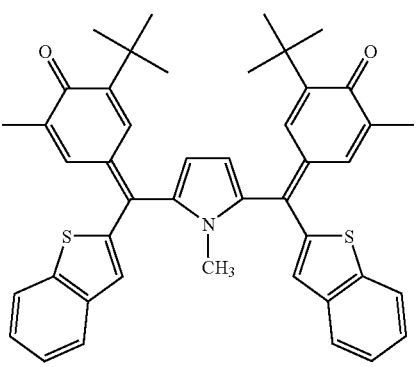
(I-12)
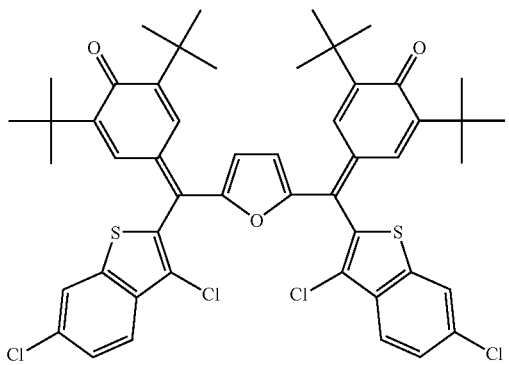
(I-13)
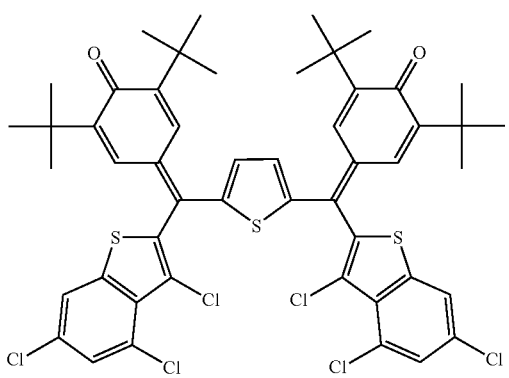

(I-14)
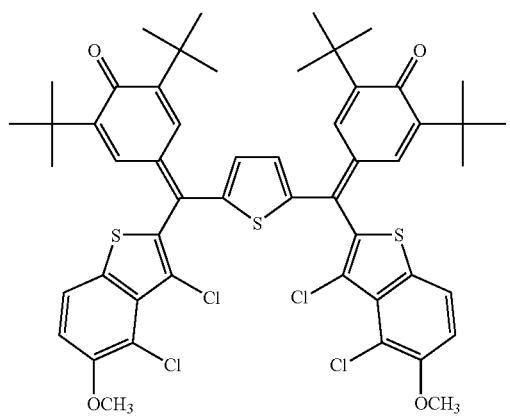
(I-15)
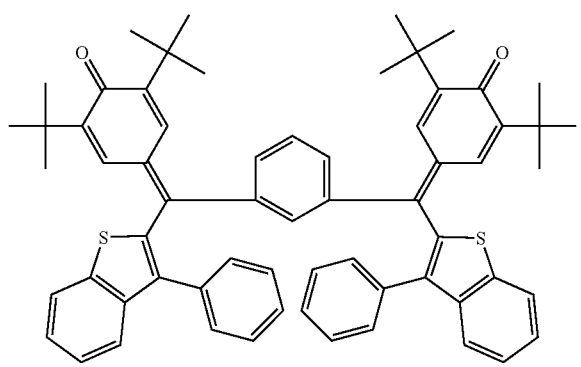
(I-16)
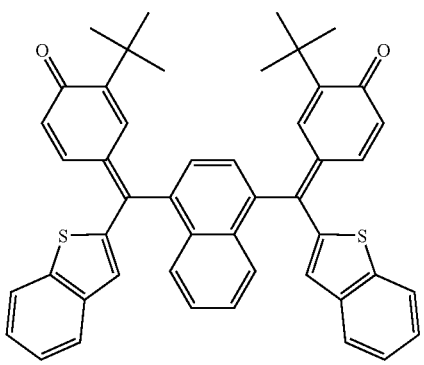
(II-1)
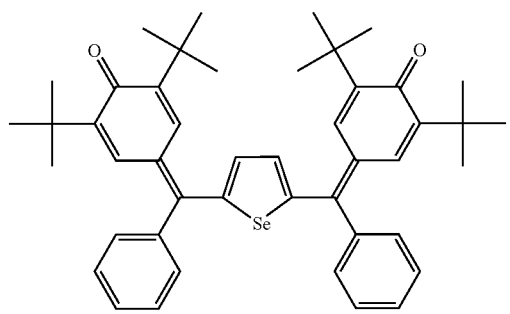
(II-2)
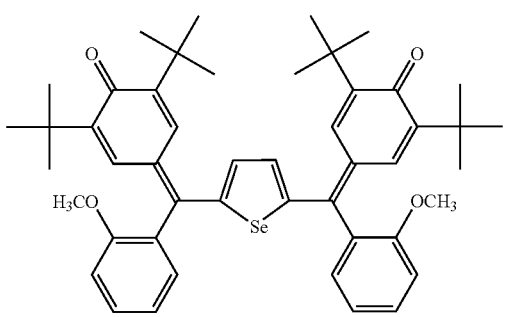
(II-3)
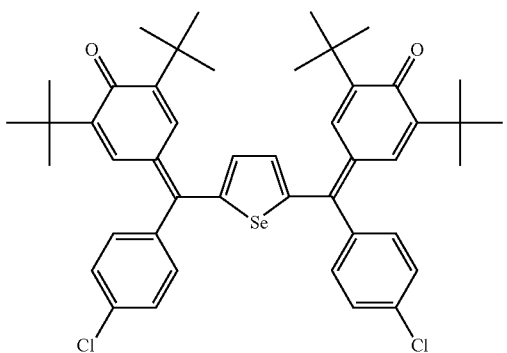
(II-4)
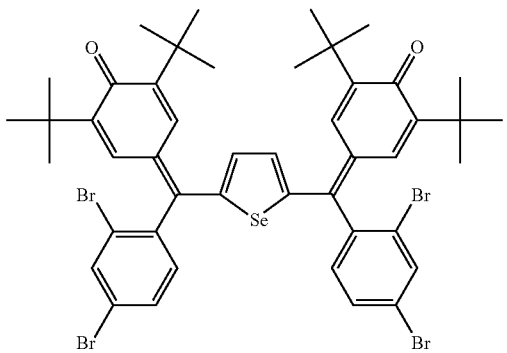
(II-5)
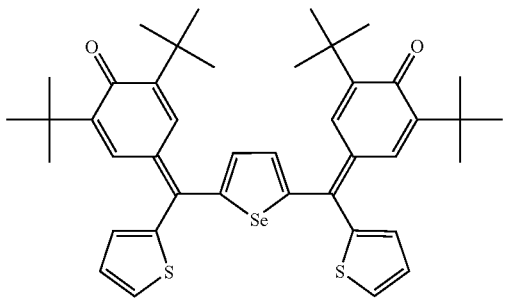

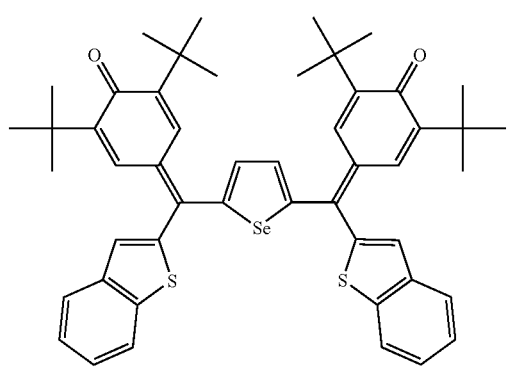
(II-6)
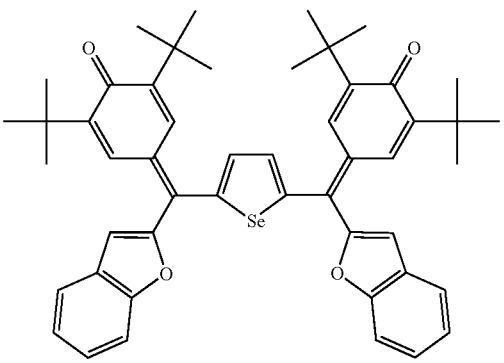
(II-10)
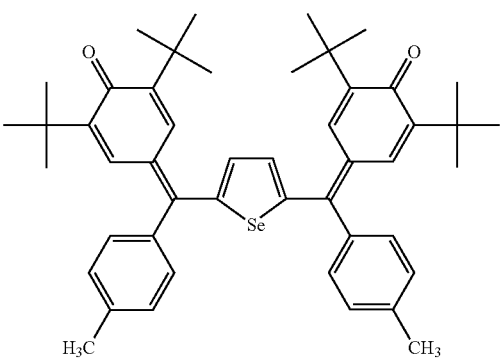
(II-11)
(II-7)
(II-8)
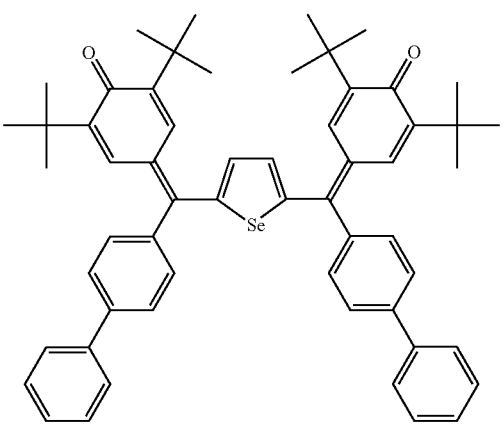
(II-12)
(II-9)
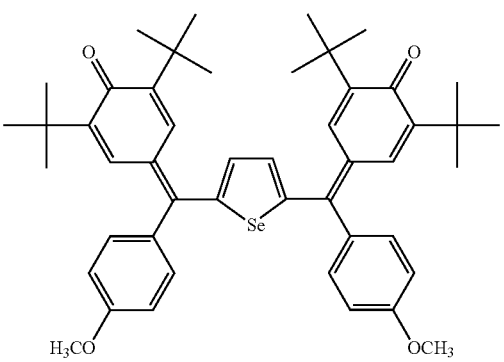
(II-13)

Among the quinone compounds of the general formula (I), the compound represented by the structural formula (I-1) can be synthesized through the reaction formula (1) below.

In THF solution of 36 mmol (12.9 g) of 4-bromo-2,6-di-tert-butyl-1-[trimethylsilyl] benzene (a compound of structural formula (a)), 40 mmol (25 ml) of 1.6 M n-butyl lithium hexane solution is dropped in an environment of nitrogen at −78° C. and 12 mmol (4.8 g) of the compound of structural formula (b) is added, and stirred at room temperature.

After that, an aqueous solution of ammonium chloride and then 36 mmol (36 ml) of THF solution of 1.0 M tetrabutyl ammonium fluoride (TBAF) are dropped into this liquid to obtain a compound of structural formula (c). After adding a small amount of p-toluene sulfonic acid monohydrate (p-TsOH), the liquid is heated and circulated. The solvent is evaporated and the remaining solid component is recrystallized with a mixed solvent of chloroform and hexane. Thus, the compound of structural formula (I-1) can be obtained.

Yield amount of the compound synthesized by the above procedure is 5.4 g (yield rate of 69.1%). Mass spectrometry on the compound has resulted in MS m/z 780 (M+) and the structure of the structural formula (I-1) has been confirmed.

Reaction formula (1)

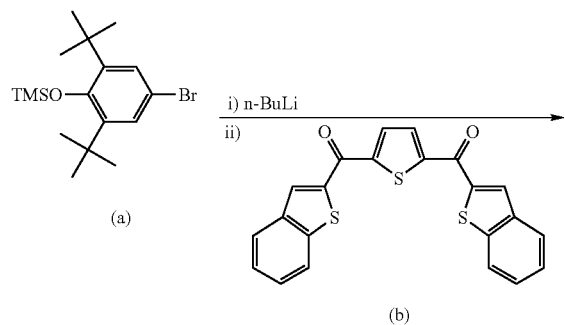

(a)

(b)

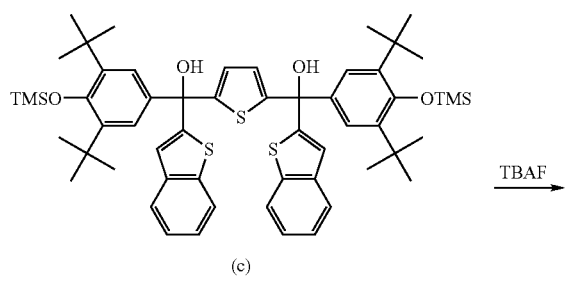

TBAF (c)

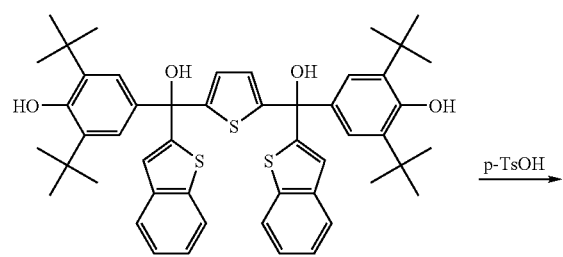

p-TsOH

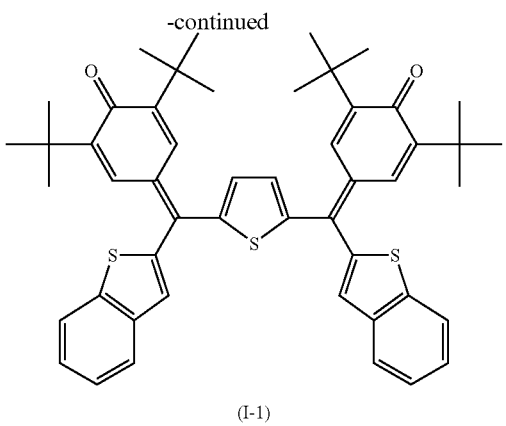

(I-1)

The above synthesis method is disclosed in further detail in Japanese Unexamined Patent Application Publication No. 2003-238561.

The compound of structural formula (a), 4-bromo-2,6-di-tert-butyl-1-[trimethylsilyl] benzene, can be synthesized by a known method for example, the method disclosed in Japanese Unexamined Patent Application Publication No. 2001-222122. The compound of structural formula (b) can be readily synthesized, for example, through the reaction formulas (2) and (3) below.

After mixing 50 mmol (9.8 g) of benzo[b]thiophene-2-carbonyl chloride (structural formula (d)), 55 mmol (5.4 g) of N,O-dimethyl hydroxyamine hydrochloride, and dichloromethane, 150 mmol (11.9 g) of pyridine is dropped in the mixture in a nitrogen atmosphere. Then, 100 ml of water is added to terminate the reaction. The organic layer is extracted and distillation is conducted under reduced pressure. Thus, benzo[b]thiophene-2-caroboxyamine (structural formula (e)) is obtained in a yield amount of 10.4 g (yield rate of 94.0%).

Then, after mixing 20 mmol (1.7 g) of thiophene (structural formula (f)), 44 mmol (5.1 g) of tetramethyl ethylene diamine, and hexane, 44 mmol (27.5 ml) of 1.6 M n-butyl lithium hexane solution is dropped into the liquid under a condition of 0° C. (ice bath) and nitrogen atmosphere. Then, the liquid is heated and circulated. After that, the liquid is cooled down to −78° C. and tetrahydrofuran and 44 mmol (9.7 g) of the compound of structural formula (e) obtained through the above reaction are added. An aqueous solution of ammonium chloride is added to the resulting liquid, and the liquid is condensed. Thus, crude compound of structural formula (b) is obtained in a yield amount of 5.3 g (yield rate of 65.5%).

Reaction formula (2)

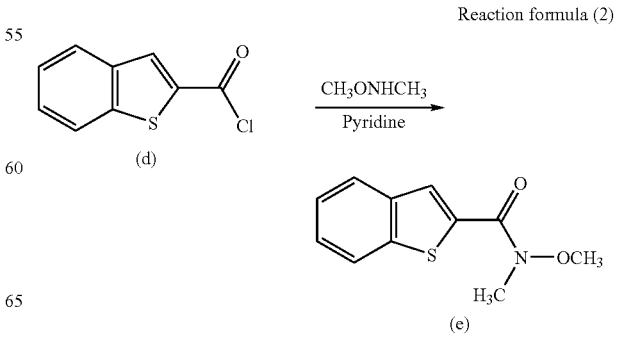

-continued

Reaction formula (3)

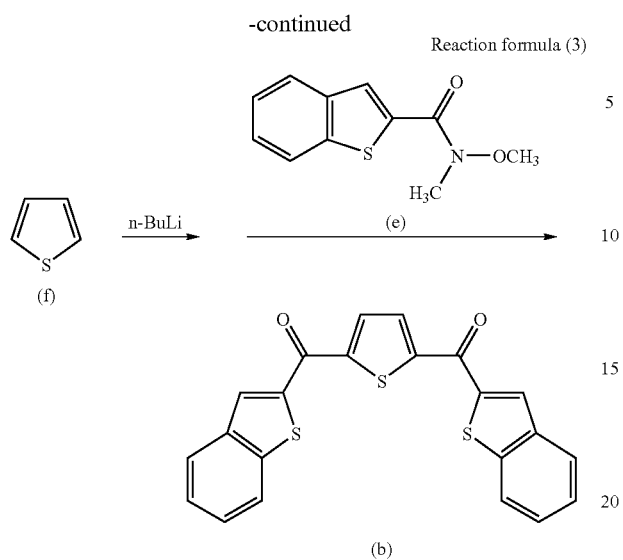

The compound of structural formula (d), benzo[b]thiophene-2-carbonyl chloride, is available from Lancaster Synthesis Company (Japanese agency Hydrus Chemical Inc.).

Among the quinone compounds represented by the general formula (II), the compound of structural formula (II-1), for example, can be synthesized through reaction formula (4) below.

Into THF solution of 30 mmol (10.7 g) of 4-bromo-2,6-di-t-butyl-1-[trimethylsilyl] benzene (structural formula (a)), 33 mmol (21 ml) of 1.6 M n-butyl lithium hexane solution is dropped under a condition of −78° C. and nitrogen atmosphere and 10 mmol (3.4 g) of the compound of structural formula (g) is added, and stirred at room temperature.

After that, an aqueous solution of ammonium chloride and 30 mmol (30 ml) of THF solution of 1.0 M tetrabutyl ammonium fluoride (TBAF) are dropped into the liquid, obtaining the compound of structural formula (h). Further adding a small quantity of p-toluene sulfonic acid monohydrate (p-TsOH), the liquid is heated and circulated. The solvent is evaporated and the solid component is recrystallized with a mixed solvent of chloroform and hexane. Thus, the compound of structural formula (II-1) can be obtained.

The yield amount of the compound obtained by the above described synthesis method is 3.4 g (yield rate of 47.8 %). Mass spectrometry has resulted in MS m/z 716 (M+), confirming the structure of the structural formula (II-1).

Reaction formula (4)

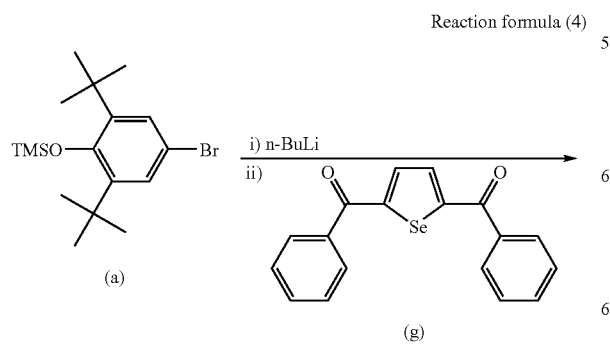

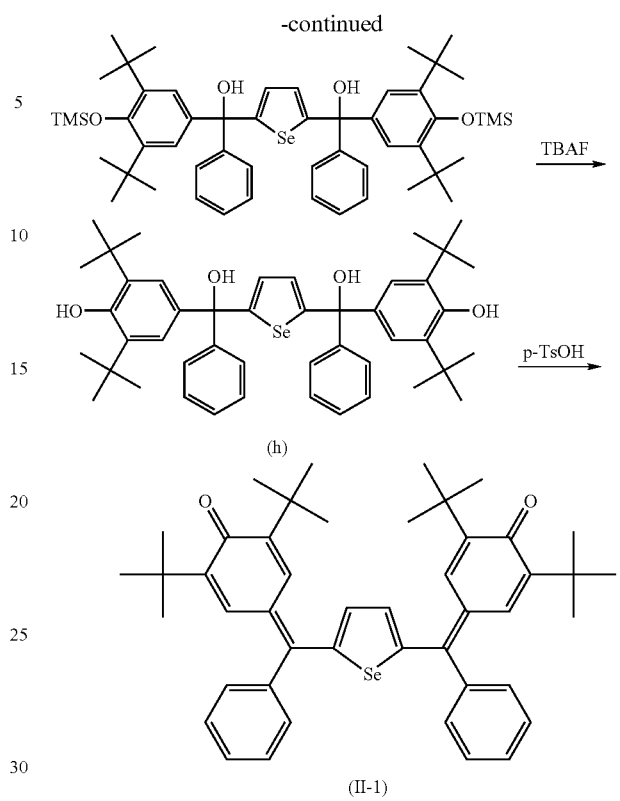

The compound of structural formula (g), 2,5-diphenoxyselenophene, can be synthesized for example, by the method disclosed in the reference: J. Nakayama, M. Shibuya, and M. Hoshino, Heterocycles, vol. 26, pp. 909-912 (1987).

It has been reported for quinone compounds that their dipole moments are involved in the switching performance (Preprints for The 65th Meeting of the Japanese Society of Applied Physics, No. 3, 1a-ZT-1, p. 1160 (2004) (in Japanese)). The dipole moment can be estimated by molecular orbital computation. The behavior of the molecules can be simulated with variable parameters of temperature, pressure, and applied electric field, and the energy state can be analyzed by molecular dynamics computation. Existing software for molecular orbital simulation includes WinMOPAC V2.0 (a product of Fujitsu Limited) and CAChe 5.0 (a product of Fujitsu Limited), which use MOPAC, a semi-empirical molecular orbital computation procedure. Existing software for molecular orbital simulation includes WinMASPYC 2.0 (a product of Fujitsu Limited).

In the invention, a stable structure of a compound can be worked out by the molecular orbital computation, and the behavior of a molecule in an applied electric field can be simulated by molecular dynamics computation, thereby theoretical characteristics can be analyzed on a compound for organic bistable material. By this method, bistable characteristics of a compound can be predicted based on the structure of the compound. As a result, costs can be reduced in studies to search for the organic bistable materials.

Since an organic bistable material in a switching device of the invention is a one-component system consisting of one type of material, the analysis can be readily carried out for the theoretical characteristics as described above.

Organic bistable material layer 30 can be formed by a vacuum evaporation method, a spin-coating method, an electrolytic polymerization method, a chemical vapor deposition method (CVD method), a method of built-up monomolecular film (LB method), a dipping method, a bar coating method, an ink jet method, and a screen printing method, without any special limitation. When organic bistable material layer 30 is formed by vacuum evaporation, the substrate temperature in the evaporation process is appropriately selected corresponding to the organic bistable material and preferably in the range of 0 to 100° C. A film thickness is preferably in the range of 20 to 150 nm. When organic bistable material layer 30 is formed by an application method such as spin coating, application solvent can be selected from halogen-containing solvent such as dichloromethane, dichloroethane, chloroform, ethers such as tetrahydrofuran (THF) and ethylene glycol dimethyl ether, aromatic compounds such as toluene and xylene, alcohols such as ethyl alcohol, esters such as ethyl acetate and butyl acetate, ketones such as acetone, MEK, and acetonitrile. A coating liquid is prepared by dissolving an organic bistable material in a concentration from 0.001 to 30 wt % in one of these solvents and adding a binder resin as necessary. The binder resin can be selected from polycarbonate, polyester, poly(vinyl alcohol), polystyrene, and the like. Conditions in the spin coating can be appropriately set depending on the aimed thickness, and the rotating speed is preferably in the range of 200 to 3,600 rpm.

Figure 2:
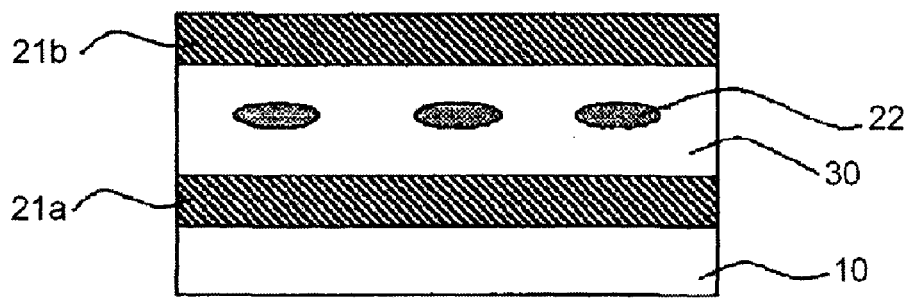
FIG. 2 illustrates a schematic structure of a switching device according to another embodiment of the invention.
Figure 3:
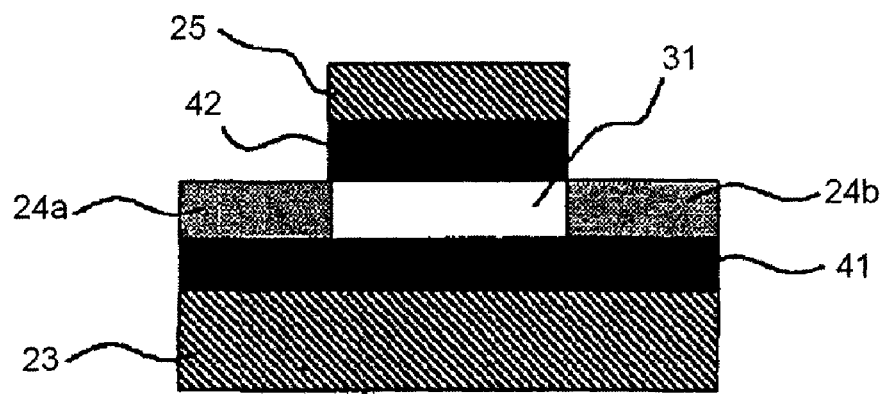
FIG. 3 illustrates a schematic structure of a switching device according to yet another embodiment of the invention.

A structure of a switching device of the invention is not limited to the structure of FIG. 1, but the structures of FIGS. 2 and 3 are possible, too. FIG. 2 shows another embodiment of a switching device of the invention. This embodiment differs from the embodiment of FIG. 1 in that the device of FIG. 2 is a three-terminal device having third electrode layer 22 in organic bistable material layer 30. In this structure, electrode layers 21a and 21b supply current and apply bias voltage Vb as in FIG. 7, and third electrode layer 22 applies lower threshold voltage Vth1 or upper threshold voltage Vth2 as in FIG. 7 to control the resistance state of organic bistable material layer 30.

FIG. 3 shows yet another embodiment of a switching device of the invention. This embodiment is a four-terminal device that comprises third electrode layer 23, insulator layer 41 formed on third electrode layer 23, organic bistable material layer 31, electrodes 24a and 24b on both sides of the organic bistable material layer 31, organic bistable material layer 31 and electrode layers 24a and 24b being formed on insulator layer 41, insulator layer 42 and fourth electrode 25 sequentially formed on organic bistable material layer 31.

Figure 7:
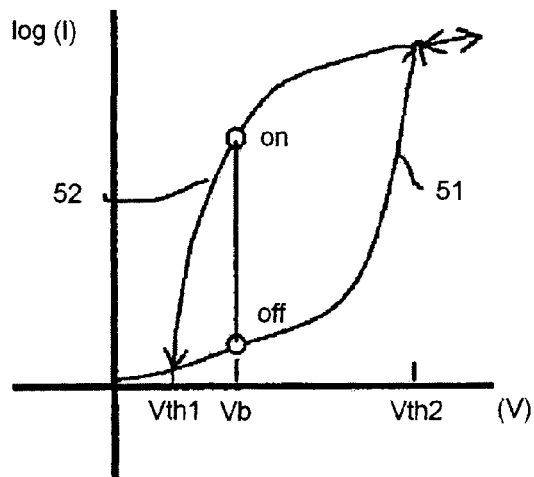
FIG. 7 shows a conceptual current-voltage characteristic of a conventional switching device.
Figure 8:
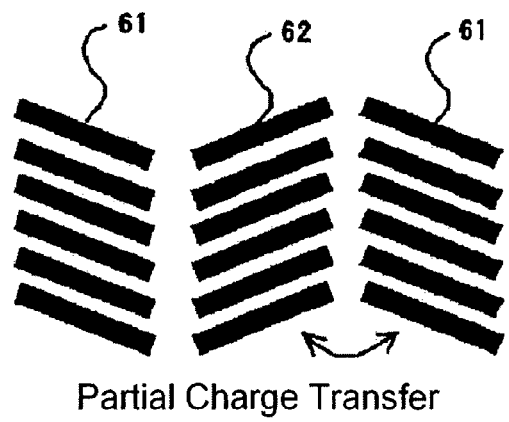
FIG. 8 shows a schematic structure of a conventional organic bistable material of two-component system.

In a specific structure of this switching device, third electrode layer 23 can be a silicon substrate; insulator layers 41 and 42 can be evaporation films of metal oxide; and electrode layers 24a, 24b, and fourth electrode layer 25 can be evaporation films of aluminum. Bias voltage Vb as in FIG. 7 is applied on electrode layers 24a and 24b to supply additional current. Third electrode layer 23 and fourth electrode 25 apply an electric field on organic bistable material layer 31 to control the resistance state of organic bistable material layer 31.

EXAMPLES

A switching device of the invention will be described in further detail with reference to some specific examples.

Example 1

A switching device having a structure of FIG. 1 was produced in the following procedure. A glass substrate was used for substrate 10. Thin films of first electrode layer 21a, organic bistable material layer 30, and second electrode layer 21b having thicknesses of 100 nm, 80 nm, and 100 nm, respectively, were sequentially formed on the substrate by means of vacuum evaporation method, to form a switching device of Example 1.

Evaporation sources were aluminum for first electrode layer 21a and second electrode layer 21b, and a quinone compound represented by the structural formula (I-1) for organic bistable material layer 30. The evaporation apparatus was evacuated to $3 \times 10^{-6}$ torr by a diffusion pump. The evaporation of aluminum was conducted by a resistance heating method with a deposition speed of 3 Å/sec; the evaporation of the quinone compound was conducted by a resistance heating method with a deposition speed of 2 Å/sec. The processes of evaporating the layers were conducted continuously in the same evaporation apparatus so that the samples did not come in contact with the air in the evaporation process.

Example 2

A switching device was produced in the same manner as in Example 1 except that the organic bistable material represented by the structural formula (I-1) used in Example 1 was replaced by the organic bistable material represented by the structural formula (I-2).

Example 3

A switching device was produced in the same manner as in Example 1 except that the organic bistable material represented by the structural formula (I-1) used in Example 1 was replaced by the organic bistable material represented by the structural formula (II-1).

Test Example 1

Figure 4:
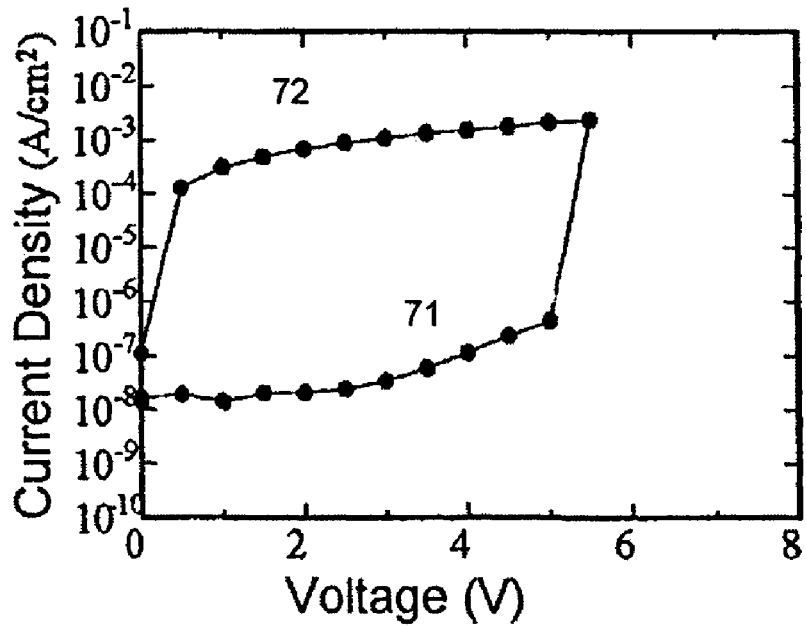
FIG. 4 shows a current-voltage characteristic of the switching device of Example 1.
Figure 5:
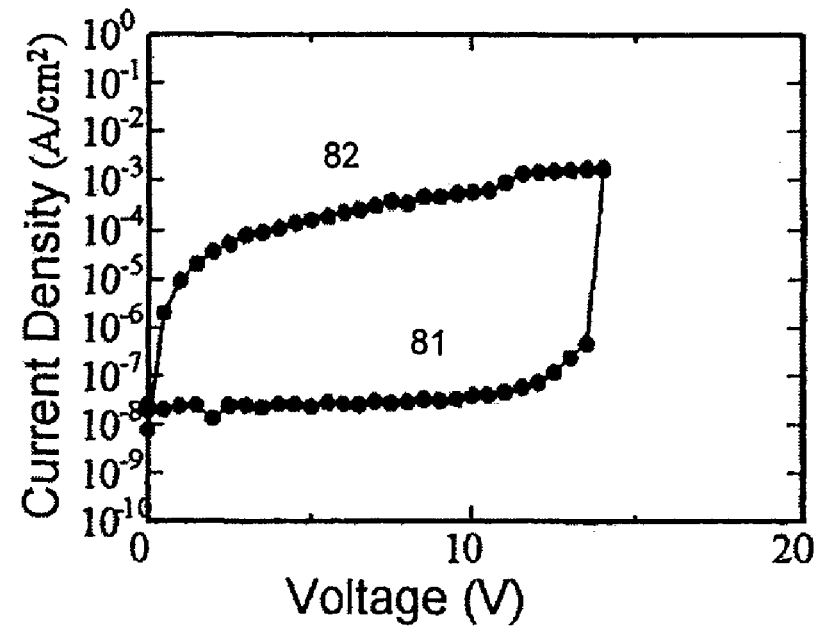
FIG. 5 shows a current-voltage characteristic of the switching device of Example 2.
Figure 6:
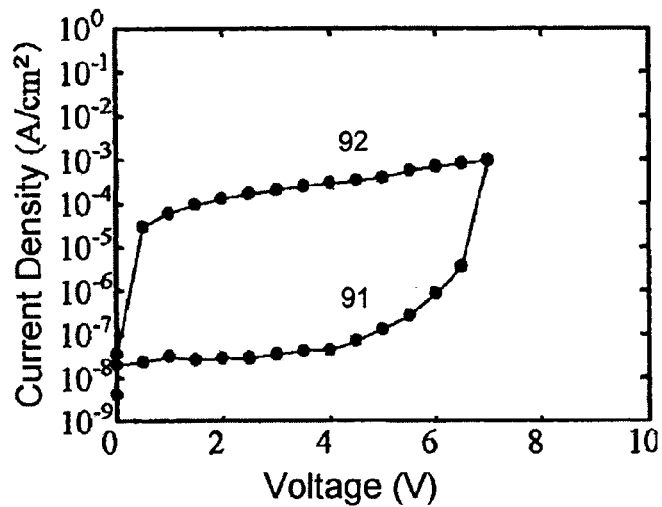
FIG. 6 shows a current-voltage characteristic of the switching device of Example 3.

A current-voltage characteristic was measured in an environment at room temperature on each of the switching devices of Examples 1 through 3. Table 1 shows the measurement results of lower threshold voltage Vth1 and upper threshold voltage Vth2, the threshold voltages as in FIG. 7. FIGS. 4 through 6 show the current-voltage characteristics on the switching devices of Examples 1 through 3. Each device in the measurements was connected to an electric resistance in the range of 100 Ω to 1 MΩ in series to control the on state current and avoid damage of the device due to overcurrent.

TABLE 1

|           | Vth1 (V) | Vth2 (V) |
|-----------|----------|----------|
| Example 1 | 0        | 5.5      |
| Example 2 | 0        | 14.0     |
| Example 3 | 0        | 6.5      |

As is apparent in FIG. 4, the switching device of Example 1 demonstrated bistability of high resistance state 71 and low resistance state 72. When an applied voltage was the lower threshold voltage Vth1 that is 0 V, the resistance changed and a transition occurred from low resistance state 72 to high resistance state 71 (from an on state to an off state). When an applied voltage was equal to or higher than the upper threshold voltage Vth2 that is 5.5 V or higher, the resistance changed and a transition occurred from high resistance state 71 to low resistance state 72 (from an off state to an on state). At this time, ratio of the resistance in the high resistance state/the resistance in the low resistance state obtained was about $5 \times 10^3$.

As is apparent in FIG. 5, the switching device of Example 2 demonstrated bistability of high resistance state 81 and low resistance state 82. When an applied voltage was the lower threshold voltage Vth1 that is 0 V or lower, the resistance changed and a transition occurred from low resistance state 82 to high resistance state 81 (from an on state to an off state). When an applied voltage was equal to or higher than the upper threshold voltage Vth2 that is 14.0 V or higher, the resistance changed and a transition occurred from high resistance state 81 to low resistance state 82 (from an off state to an on state). At this time, ratio of the resistance in the high resistance state/the resistance in the low resistance state obtained was about $3 \times 10^3$.

As is apparent in FIG. 6, the switching device of Example 3 demonstrated bistability of high resistance state 91 and low resistance state 92. When an applied voltage was the lower threshold voltage Vth1 that is 0 V or lower, the resistance changed and a transition occurred from low resistance state 92 to high resistance state 91 (from an on state to an off state). When an applied voltage was equal to or higher than the upper threshold voltage Vth2 that is 6.5 V or lower, the resistance changed and a transition occurred from high resistance state 91 to low resistance state 92 (from an off state to an on state). At this time, ratio of the resistance in the high resistance state/the resistance in the low resistance state obtained was about $3 \times 10^2$.

All the switching devices of Examples 1 through 3 demonstrated bistability and exhibited bistable states with lower threshold voltages Vth1 of 0 V and upper threshold voltages Vth2 of from 5.5 V to 14.0 V, as shown in Table 1.

Experimental Example 1

As described previously, it has been reported for quinone compounds that their dipole moments are involved in the switching performance (Preprints for The 65th Meeting of the Japanese Society of Applied Physics, No. 3, 1a-ZT-1, p. 1160 (2004) (in Japanese)).

Accordingly, a simulation experiment was conducted as described below on the quinone compound represented by the structural formula (III-1) below (hereinafter referred to as a compound III-1). The software for molecular orbital simulation was CAChe 5.0 (a product of Fujitsu Limited).

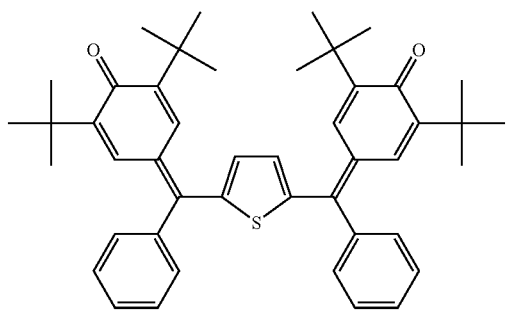

(III-1)

Figure 9:
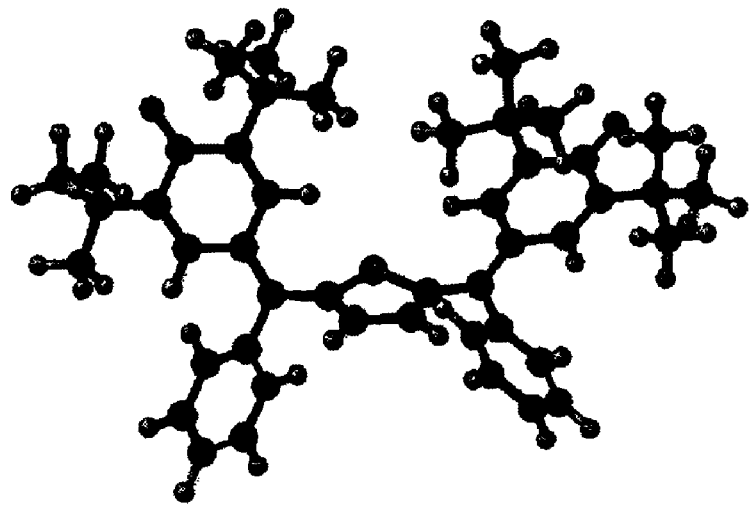
FIG. 9 shows a molecular model of an optimum structure of a compound represented by the structural formula III-1.

The initial structure was the optimized structure shown by the molecular model in FIG. 9. The dihedral angle between the thiophene ring and the quinone structure at the one side of the compound III-1 was varied (rotated) over 360 degrees with an increment of ten degrees. On each structure with each dihedral angle, the energy of formation of a stable state was calculated to obtain a bipolar angle—energy of formation curve. The resulted curve is shown in FIG. 10.

Figure 11:
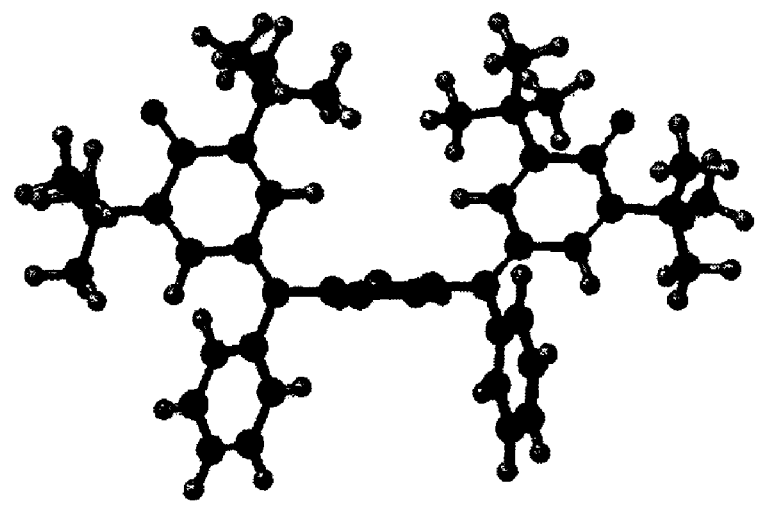
FIG. 11 shows a molecular model of syn structure of a compound represented by the structural formula III-1.
Figure 10:
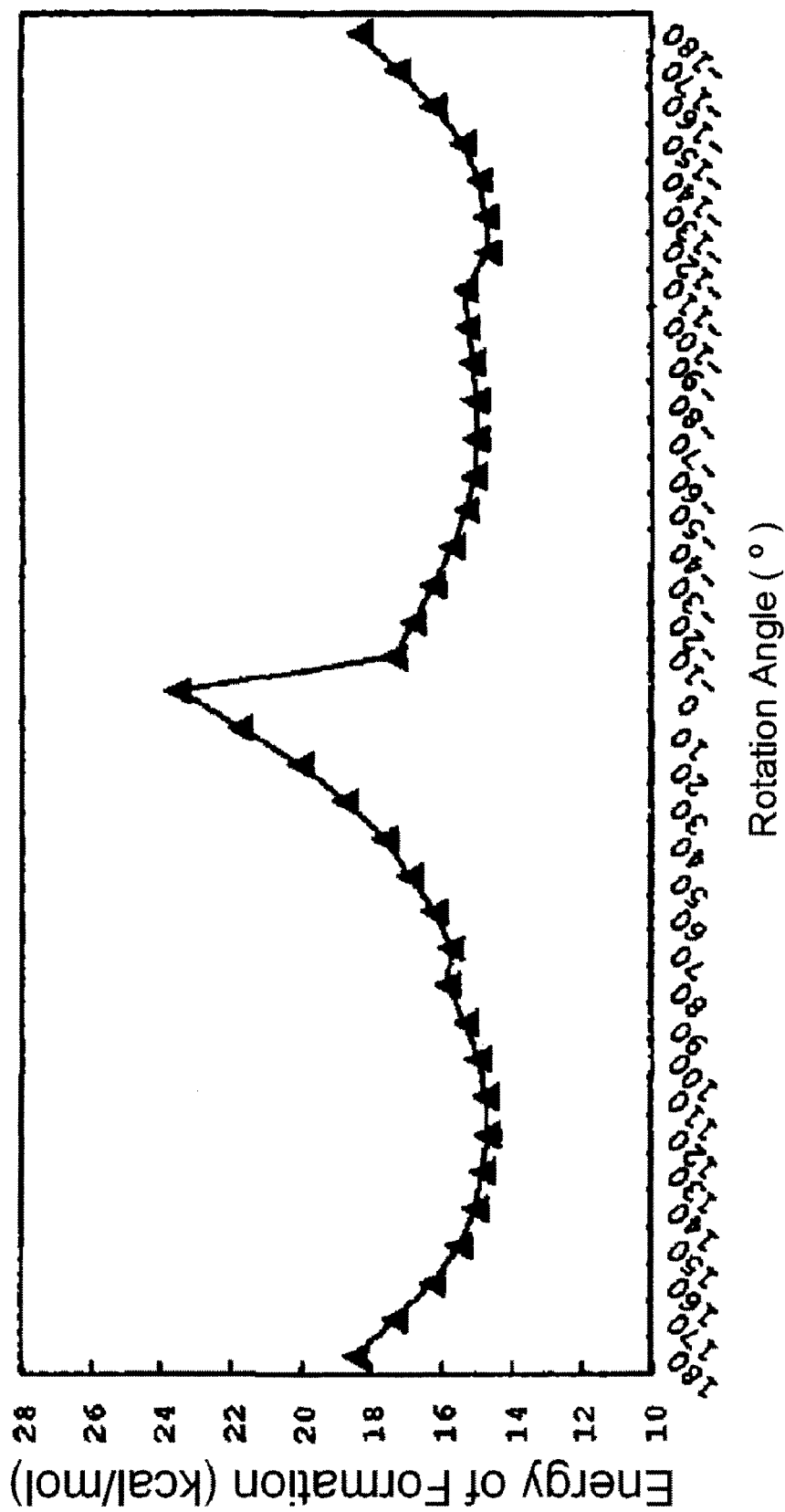
FIG. 10 is a rotation angle—energy of formation curve in Experimental Example 1.
Figure 12:
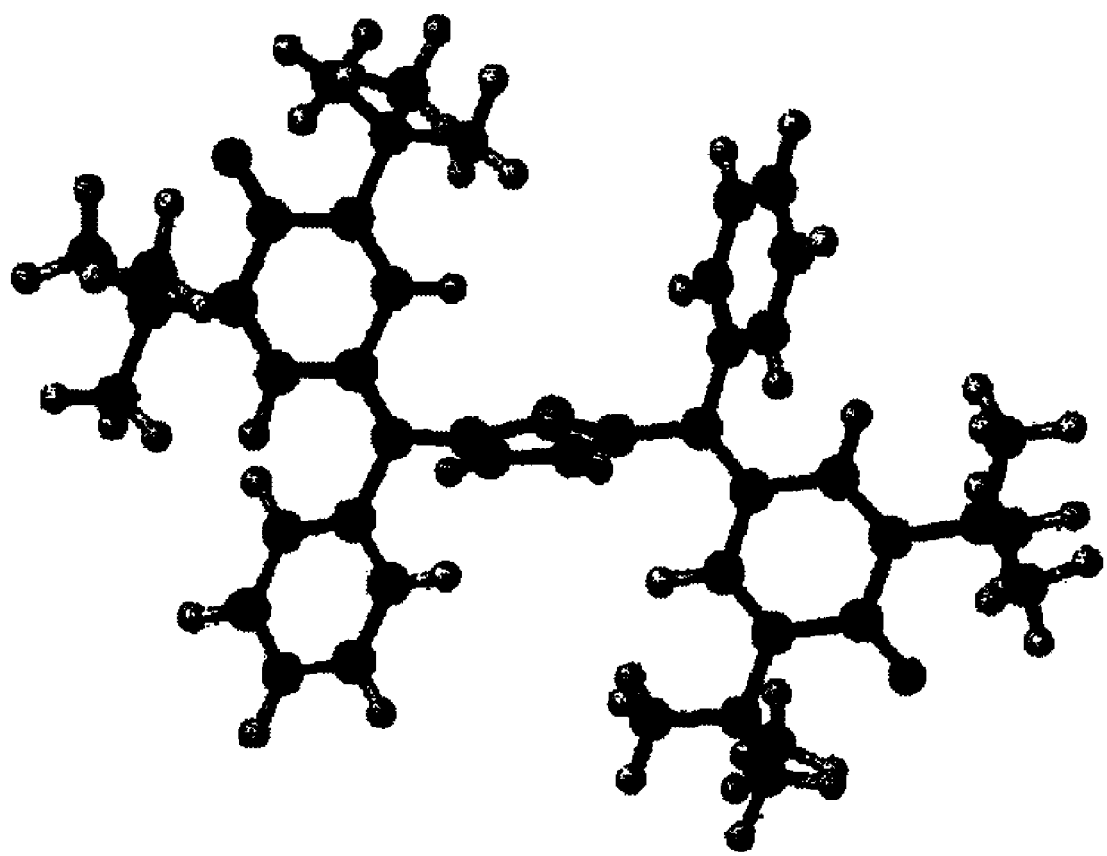
FIG. 12 shows a molecular model of anti structure of a compound represented by the structural formula III-1.

As apparent in the bipolar angle—energy of formation curve in FIG. 10, the curve has two approximately equal minimum values of energy of formation (14.7 kcal/mol) for the structures of the dihedral angles of 120° and −120°. This has demonstrated that two stable states of energy emerge when molecular structure is varied. Hereinafter, the structure with dihedral angle between quinone structures of 120° is referred to as a syn structure and the structure with dihedral angle of −120° is referred to as an anti structure. FIG. 11 shows a molecular model of the syn structure of the compound III-1, and FIG. 12 shows a molecular model of the anti structure.

On the obtained syn structure and anti structure of the compound III-1, a dipole moment was calculated using the software for molecular orbital simulation CAChe 5.0 (a product of Fujitsu Limited). The results were 7.2 debye for the dipole moment of the syn structure of the compound III-1 and 1.1 debye for the dipole moment of the anti structure of the compound III-1. These results are summarized in Table 2.

TABLE 2

| bipolar angle (deg) | energy of formation (kcal/mol) | dihedral angle between quinone structures (deg) | dipole moment (debye) |
|---|---|---|---|
| 120 (syn structure) | 14.7 | 25 | 7.2 |
| −120 (anti structure) | 14.7 | 173 | 1.1 |

From the above results, it has been demonstrated that two stable structures with different dipole moments are obtained in the molecular models of the compound III-1, and it has been suggested that structure transformation between these structures or the like structure transformation contributes to the bistable property of the compound III-1.

Experimental Example 2

Then, molecular dynamics simulation was conducted on the syn structure of the compound III-1 obtained by the molecular orbital simulation. In the molecular dynamics simulation, a molecule of the syn structure of the compound III-1 was positioned in a cell with an arbitrary size, and the behavior of the molecule was simulated when an electric field of $10^8$ V/m was applied along X-axis. The software used was WinMASPHYC 2.0 (a product of Fujitsu Limited).

Experimental Example 3

Molecular dynamics simulation was conducted in the same manner as in Experimental Example 2 except that the syn structure of the compound III-1 was replaced by the anti structure.

Experimental Example 4

Molecular dynamics simulation was conducted in the same manner as in Experimental Example 3 except that the applied electric field of $10^8$ V/m was replaced by $10^{10}$ V/m.

Figure 13:
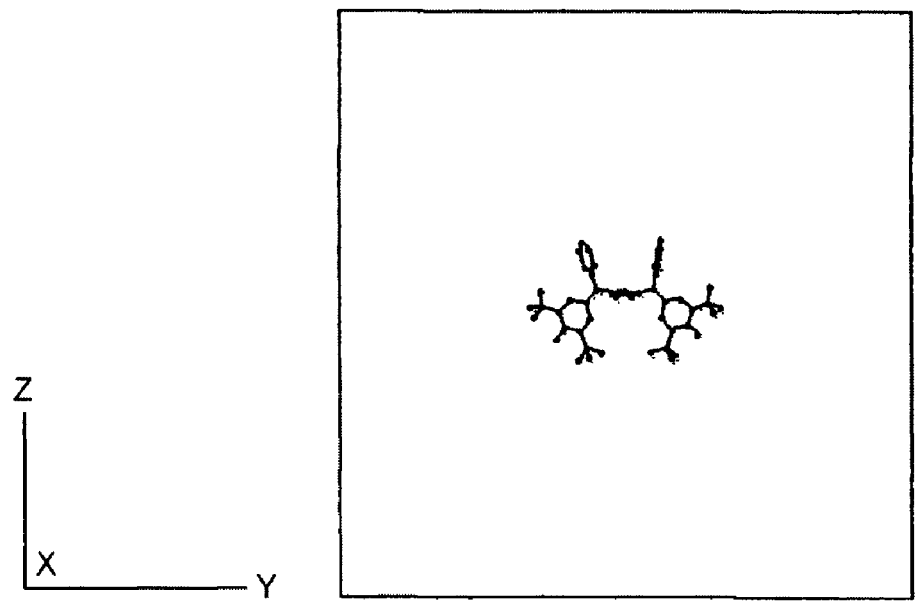
FIG. 13 shows an input molecular model for the molecular dynamics simulation in Experimental Example 2.
Figure 14:
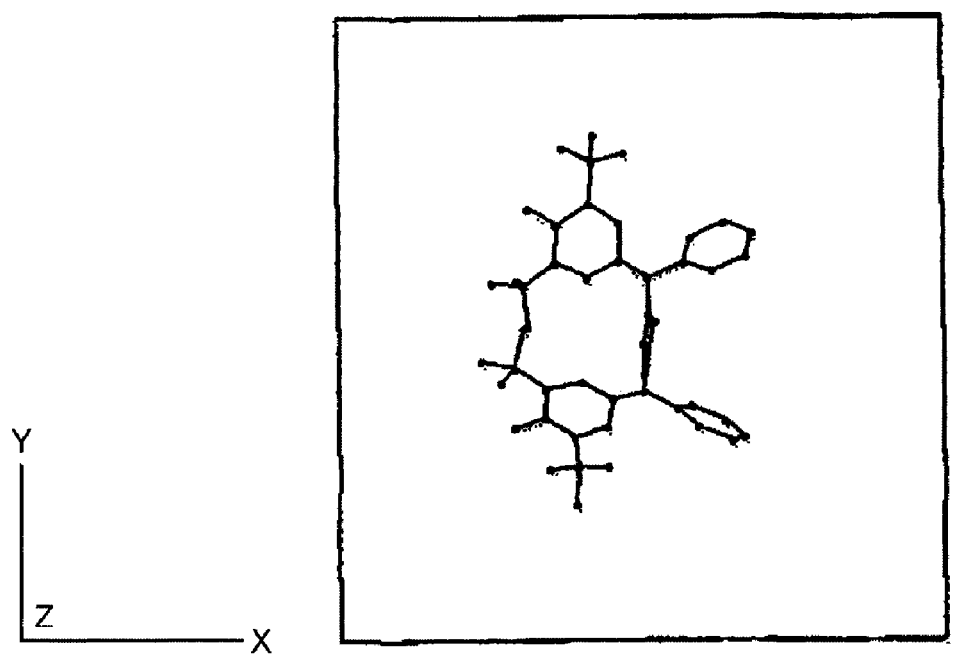
FIG. 14 shows an output molecular model for the molecular dynamics simulation in Experimental Example 2.
Figure 15:
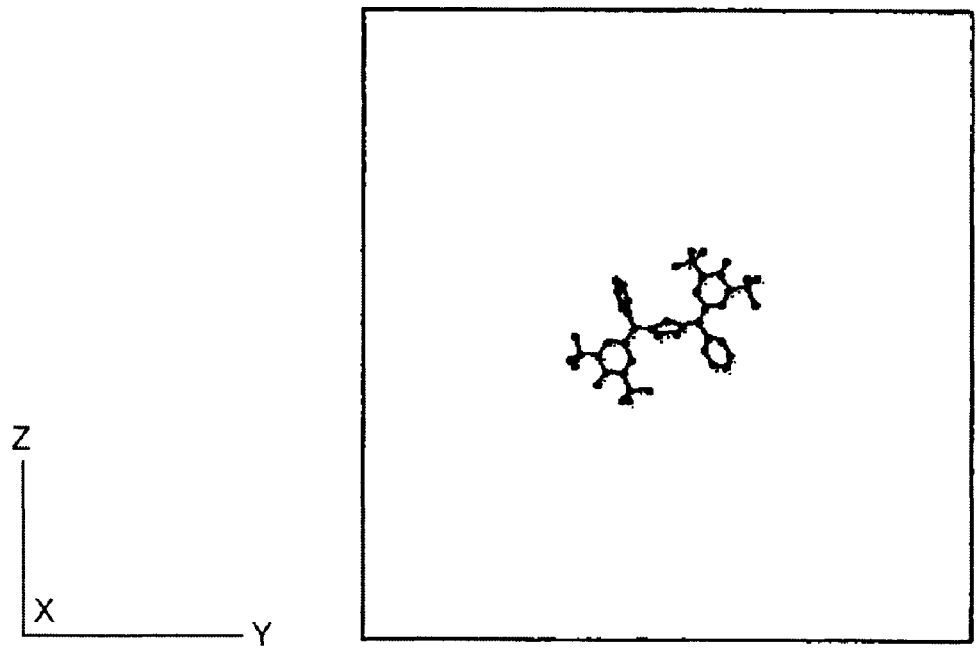
FIG. 15 shows an input molecular model for the molecular dynamics simulation in Experimental Example 3.
Figure 16:
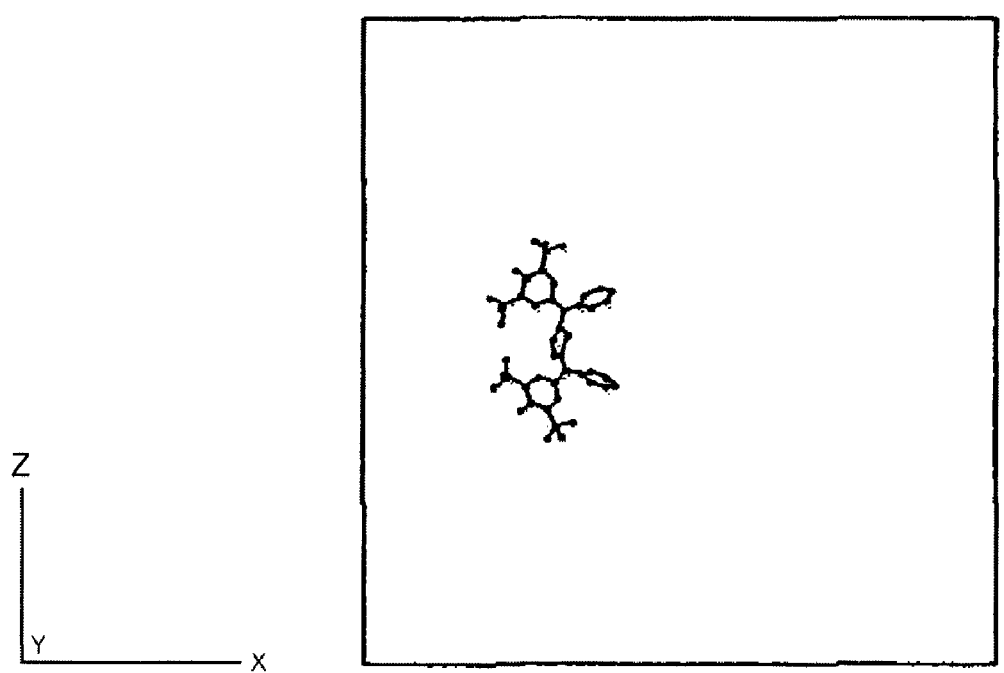
FIG. 16 shows an output molecular model for the molecular dynamics simulation in Experimental Example 3.

The results of Experimental Examples 2 through 4 are given in Table 3. The input molecular model of the syn structure of the compound III-1 is shown in FIG. 13, and the output molecular model is shown in FIG. 14. The input molecular model of the anti structure of the compound III-1 is shown in FIG. 15, and the output molecular model is shown in FIG. 16.

TABLE 3

| | electric field | time of structure transformation |
|---|---|---|
| Experimental Example 2 | $10^8$ V/m | structure transformation did not occur |
| Experimental Example 3 | $10^8$ V/m | 45 ps |
| Experimental Example 4 | $10^{10}$ V/m | 2 ps |

In the Experimental Example 2, structure transformation did not occur by the application of electric field along X-axis when the input structure was the syn structure of the compound III-1. Though not shown as experimental examples, the structure transformation also did not occur by the application of electric field along Y-axis or Z-axis.

On the other hand, in the Experimental Example 3, the structure transformation from the anti structure to the syn structure occurred by the application of electric field along X-axis when the input structure was the anti structure of the compound III-1. Though not shown as experimental examples, the structure transformation from the anti structure to the syn structure also occurred by the application of electric field along Y-axis or Z-axis. It has further been revealed from the Experimental Example 4 that the time of structure transformation decreases when the electric field strength is increased.

INDUSTRIAL APPLICABILITY

The present invention suppresses variation of material composition and achieves steady bistability characteristic, and thus, allows mass production of switching devices without variation in bistable performance and having steady quality. Such a switching device can be favorably used for driver switching device of organic EL display panels and high density memories.

Thus, a switching device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

EXPLANATION OF LETTERS OR NUMERALS

10: substrate
21a, 24a: first electrode layer
21b, 24b: second electrode layer
22, 23 third electrode layer
25: fourth electrode layer
30, 31: organic bistable material layer
41, 42: insulator layer
51, 71, 81, 91: high resistance state
52, 72, 82, 92: low resistance state
61: column of donor molecules
62: column of acceptor molecules
Vth1: lower threshold voltage
Vth2: upper threshold voltage

What is claimed is:

1. A switching device exhibiting two stable resistance values to a voltage applied between electrodes, the switching device comprising thin films of a first electrode layer, an organic bistable material layer and a second electrode layer sequentially formed on a substrate, wherein the organic bistable material is a quinone compound represented by the general formula (I):

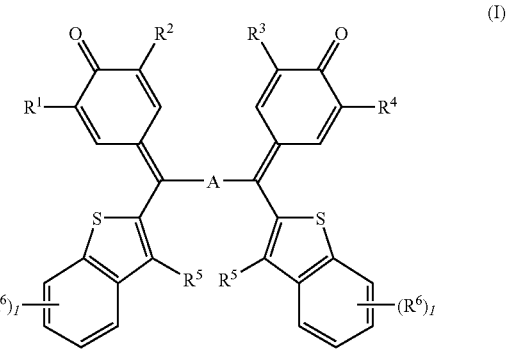

(I)

wherein $R^1$, $R^2$, $R^3$, and $R^4$, which can be the same or different from each other, and are selected from the group consisting of a hydrogen atom, an alkyl group of carbon number of 1 to 6 that can have one or more substituents, and an aryl group that can have one or more substituents; $R^5$ and $R^6$, which can be the same or different from each other, are selected from the group consisting of a hydrogen atom, an alkyl group of carbon number of 1 to 6 that can have one or more substituents, an aryl group that can have one or more substituents, an alkoxy group, and a halogen atom; "A" represents one of the formulas (A-1) through (A-9)

(A-1)

(A-2)

(A-3)

(A-4)

(A-5)

(A-6)

-continued (A-7)

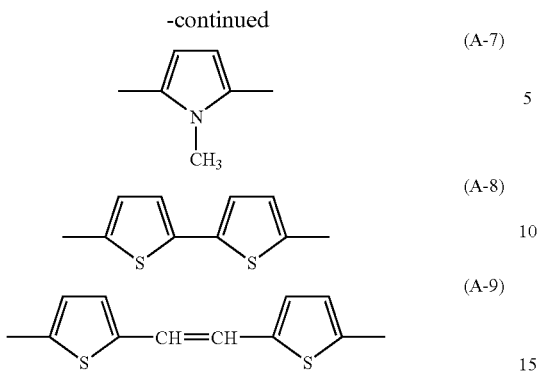

(A-8)

(A-9)

and l represents an integer from 1 to 4.

2. A switching device exhibiting two stable resistance values to a voltage applied between electrodes, the switching device comprising thin films of a first electrode layer, an organic bistable material layer and a second electrode layer sequentially formed on a substrate, wherein the organic bistable material is a quinone compound represented by the general formula (II):

(II)

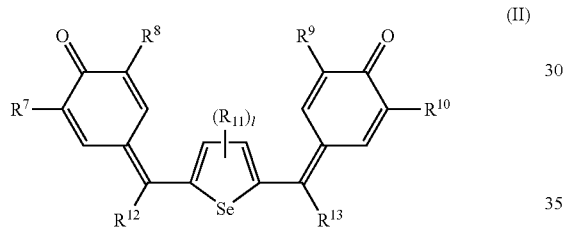

wherein $R^7$, $R^8$, $R^9$, $R^{10}$ and $R^{11}$, which can be the same or different from each other, are selected from the group consisting of a hydrogen atom, an alkyl group of carbon number of 1 to 6 that can have one or more substituents, and an aryl group that can have one or more substituents; $R^{12}$ and $R^{13}$, which can be the same or different from each other, are selected from the group consisting of a hydrogen atom, an aryl group that can have one or more substituents, and a heterocyclic group that can have one or more substituents; and l represents an integer of 1 or 2.

3. The switching device according to claim 2, wherein $R^{12}$ and $R^{13}$ in the formula (II), which can be the same or different from each other, are selected from general formulas (R-1) to (R-7):

(R-1)

(R-2)

(R-3)

-continued (R-4)

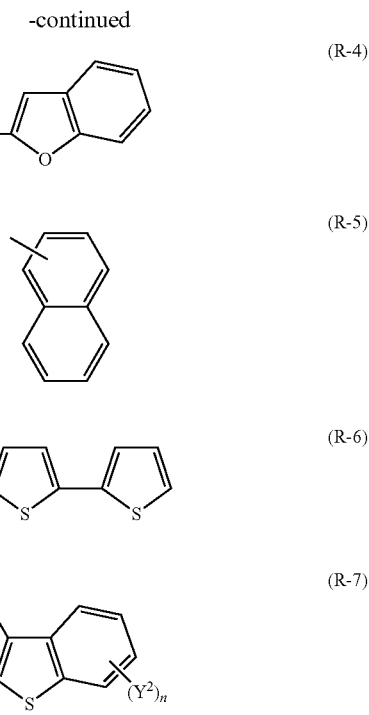

(R-5)

(R-6)

(R-7)

wherein X is selected from the group consisting of a hydrogen atom, an alkyl group of carbon number of 1 to 6 that can have one or more substituents, an aryl group that can have one or more substituents, an alkoxy group, and a halogen atom; $Y^1$ and $Y^2$, which can be the same or different from each other, are selected from the group consisting of a hydrogen atom, an alkyl group of carbon number of 1 to 6 that can have one or more substituents, an aryl group that can have one or more substituents, an alkoxy group, and a halogen atom; m is an integer from 1 to 5; and n is an integer from 1 to 4.

4. A switching device exhibiting two stable resistance values to a voltage applied between electrodes, the switching device comprising thin films of a first electrode layer, an organic bistable material layer and a second electrode layer sequentially formed on a substrate, wherein the organic bistable material is selected from quinone compounds represented by structural formulas (I-1), (I-2), and (II-1):

(I-1)

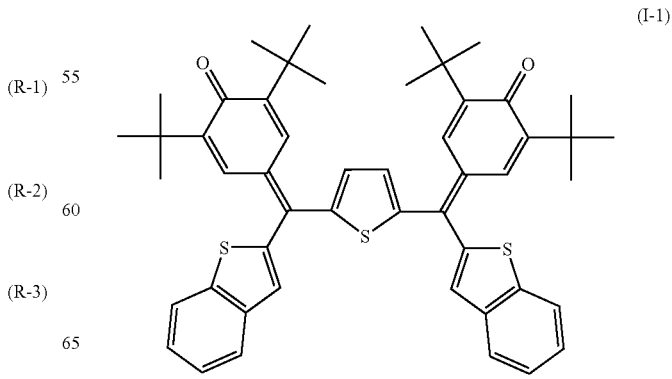

-continued
(I-2)
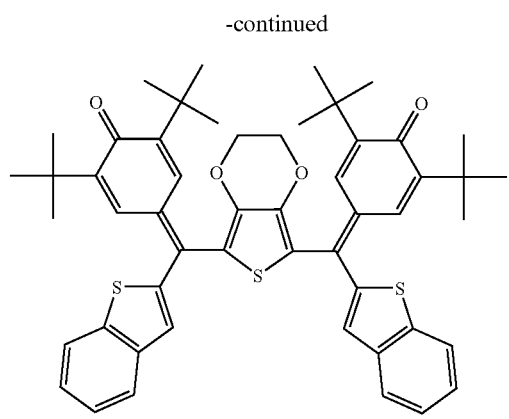
(II-1)
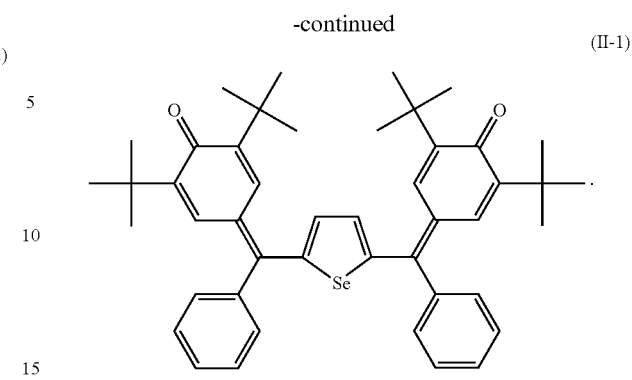
* * * * *